United States Patent
Stolpman

(10) Patent No.: US 7,482,889 B2
(45) Date of Patent: Jan. 27, 2009

(54) APPARATUS AND METHOD OF TEMPERATURE COMPENSATING AN OVENIZED OSCILLATOR

(75) Inventor: James L. Stolpman, Bloomingdale, IL (US)

(73) Assignee: CTS Corporation, Elkhart, IN (US)

(*) Notice: Subject to any disclaimer, the term of this patent is extended or adjusted under 35 U.S.C. 154(b) by 27 days.

(21) Appl. No.: 11/476,359

(22) Filed: Jun. 28, 2006

(65) Prior Publication Data

US 2008/0012655 A1 Jan. 17, 2008

(51) Int. Cl.
  *H03L 1/02* (2006.01)
(52) U.S. Cl. .................... 331/176; 331/116 R; 331/158
(58) Field of Classification Search ................... 331/65, 331/66, 68, 69, 70, 116 R, 116 FE, 154, 158, 331/160, 175, 176
See application file for complete search history.

(56) References Cited

U.S. PATENT DOCUMENTS

| | | | |
|---|---|---|---|
| 5,691,671 | A | 11/1997 | Bushman |
| 6,362,699 | B1 * | 3/2002 | Fry ............................. 331/176 |
| 6,362,700 | B1 | 3/2002 | Fry |
| 6,501,340 | B1 | 12/2002 | Flood |
| 6,545,550 | B1 * | 4/2003 | Frerking ...................... 331/44 |
| 6,870,430 | B2 * | 3/2005 | Nakamura et al. ............ 331/18 |
| 2003/0197567 | A1 | 10/2003 | Villella |
| 2006/0012446 | A1 | 1/2006 | Hardy et al. |
| 2006/0132254 | A1 * | 6/2006 | Routama et al. ............ 331/176 |

OTHER PUBLICATIONS

Micro Analog Systems Oy (MAS), 12×8-Bit D to A Converter, part specification and description, Feb. 23, 2005, pp. 1-10, Micro Analog Systems Oy, Espoo, Finland.
Bob Parkins, Sales Manager, Lap-Tech Inc., Stress Compensated Quartz Resonators, article reprinted from EP&T Magazine, Jan.-Feb. 2005, Lap-Tech Inc., Bowmanville, Ontario, Canada.
Mark A. Haney, Design Technique for Analog Temperature Compensation of Crystal Oscillators, thesis submitted to the faculty of the Virginia Polytechnic Institute and State University, copyright 2001, pp. i-viii and 9-55, Mark Haney, Blacksburg, Virginia, U.S.A.
Kahn, Klaus-Dieter, PCT International Search Report mailed: Apr. 15, 2008 International Application No. PCT/US2007/013890 filed: Jun. 13, 2007.
Kahn, Klaus-Dieter, PCT Written Opinion of the International Searching Authority mailed: Apr. 15, 2008 International Application No. PCT/US2007/013890 filed: Jun. 13, 2007.

* cited by examiner

*Primary Examiner*—Robert Pascal
*Assistant Examiner*—Ryan J. Johnson
(74) *Attorney, Agent, or Firm*—Mark P. Bourgeois

(57) ABSTRACT

An oscillator having improved frequency stability which includes an oscillator circuit and an SC-cut resonator connected with the oscillator circuit. The SC-cut resonator has a first turning point. A temperature compensation circuit is connected with the oscillator circuit. The temperature compensation circuit is adapted to adjust a reference frequency generated by the oscillator circuit according to a frequency response associated with a second turning point of an AT-cut resonator.

20 Claims, 9 Drawing Sheets

APPARATUS AND METHOD OF TEMPERATURE COMPENSATING AN OVENIZED OSCILLATOR

TECHNICAL FIELD

This invention relates to oscillators that provide a stable reference frequency signal in electronic equipment and, more specifically, to a temperature compensated crystal oscillator that is contained within an ovenized enclosure and that compensates only a portion of a Bechmann curve of frequency change with temperature.

BACKGROUND OF THE INVENTION

Various devices are well known for providing a reference frequency or source. Such devices are called oscillators and typically incorporate a quartz crystal or other type of resonator and electronic compensation circuitry to stabilize the output frequency.

Various methods are known to stabilize the output frequency as the temperature of the oscillator changes. Temperature compensated crystal oscillators (TCXOs) typically employ a thermistor network to generate a correction voltage which reduces the frequency variation over temperature. The correction voltage is usually applied to a varactor diode in the crystal circuit such that the crystal frequency may be varied by a small amount. TCXO stability can approach 0.1 PPM but several problems must be addressed.

A TCXO that resides at one temperature extreme for an extended period of time may exhibit a frequency shift when returned to normal room temperature. Usually this hysteresis or "retrace" error is temporary but a seemingly permanent offset is common. Retrace errors are usually less than about 0.1 PPM but can be much higher, especially if the mechanical tuning device (trimmer capacitor or potentiometer) is shifting. This hysteresis makes the manufacture of TCXOs with specifications approaching 0.1 PPM quite difficult. The high precision crystals found in oven oscillators exhibit less retrace but they are unsuitable for use in TCXOs because they often exhibit activity dips at temperatures below the designed oven temperature.

Further SC-cut and high overtone type crystals cannot be tuned by a sufficient amount to compensate for the frequency excursion with temperature. In addition, SC-cut crystals are very expensive.

TCXOs are preferred to oven oscillators in low power applications and where a warm-up period is not acceptable. The only warm-up time is the time required for the components to reach thermal equilibrium and the total current consumption can be very low—often determined by the output signal power requirements. Older TCXO designs employ from one to three thermistors to flatten the crystal temperature frequency curve. Newer designs employ digital logic or a microprocessor to derive a correaction voltage from values or coefficients stored in memory.

Ovenized oscillators heat the temperature-sensitive portions of the oscillator which are isolated from the ambient to a uniform temperature to obtain a more stable output. Ovenized oscillators contain a heater, a temperature sensor and circuitry to control the heater. The temperature control circuitry holds the crystal and critical circuitry at a precise, constant temperature. The best controllers are proportional, i.e., providing a steady heating current which changes with the ambient temperature to hold the oven at a precise setpoint, usually about 10 degrees above the highest expected ambient temperature.

Temperature-induced frequency variations can be greatly reduced by an amount approaching the thermal gain of the oven. The crystal for the oven is selected to have a "turning-point" at or near the oven temperature, further reducing the sensitivity to temperature. The combination of the high oven gain with operation near the turning point yields temperature stabilities approaching 0.0001 PPM over a temperature range that would cause the crystal to change by 10 PPM.

Highly polished, high-Q crystals which often have significant activity dips may be designed with no activity dips near the operating temperature, providing better stability and phase noise than crystals designed for wide temperature ranges. Ovenized oscillators allow the use of SC-cut crystals which offer superior characteristics but which are impractical for ordinary TCXOs because of their steep frequency drop at cooler temperatures. Unfortunately, SC-cut crystals are much more expensive to produce than AT-cut crystals typically used in TCXOs.

Oven oscillators have a higher power consumption than temperature compensated oscillators. Oven oscillators require a few minutes to warm up, and the power consumption is typically one or two watts at room temperature. SC-cut crystals stabilize as soon as they reach the operating temperature, but AT-cut crystals exhibit a significant thermal transient effect, which can take many minutes to settle. A typical AT-cut crystal will drop in frequency well below any point on the static crystal curve due to the sudden application of oven heat. In most oscillators, the frequency will exponentially drift back up to the nominal frequency.

In some designs, the oven controller overshoots significantly during initial warm-up and then cools back down to the final oven temperature. This cooling transient can kick the AT-cut crystal in the other direction and may actually result in a shorter warm-up time even though the controller takes longer to settle. Hand-tweaked designs can achieve fairly acceptable warm-up times with carefully selected overshoot, but the advent of quick-settling SC-cut crystals has made this approach obsolete.

Despite the advantages of prior art oscillators, an unmet need exists for an oscillator that has improved frequency stability over temperature and time and that can be manufactured at a reasonable cost.

SUMMARY OF THE INVENTION

It is a feature of the invention to provide an oscillator that includes an oscillator circuit and a resonator connected with the oscillator circuit. The resonator has a first turning point. A temperature compensation circuit is connected with the oscillator circuit. The temperature compensation circuit is adapted to adjust a reference frequency generated by the oscillator circuit according to a frequency response associated with a second turning point.

The invention resides not in any one of these features per se, but rather in the particular combination of all of them herein disclosed and claimed. Those skilled in the art will appreciate that the conception, upon which this disclosure is based, may readily be utilized as a basis for the designing of other structures, methods and systems for carrying out the several purposes of the present invention. Further, the abstract is neither intended to define the invention of the application, which is measured by the claims, nor is it intended to be limiting as to the scope of the invention in any way.

BRIEF DESCRIPTION OF THE FIGURES

These and other features of the invention can best be understood by the description of the accompanying drawings as follows.

It is noted that the drawings of the invention are not to scale. The invention will be described with additional specificity and detail through the accompanying drawings.

DETAILED DESCRIPTION OF THE PREFERRED EMBODIMENTS

Figure 1:
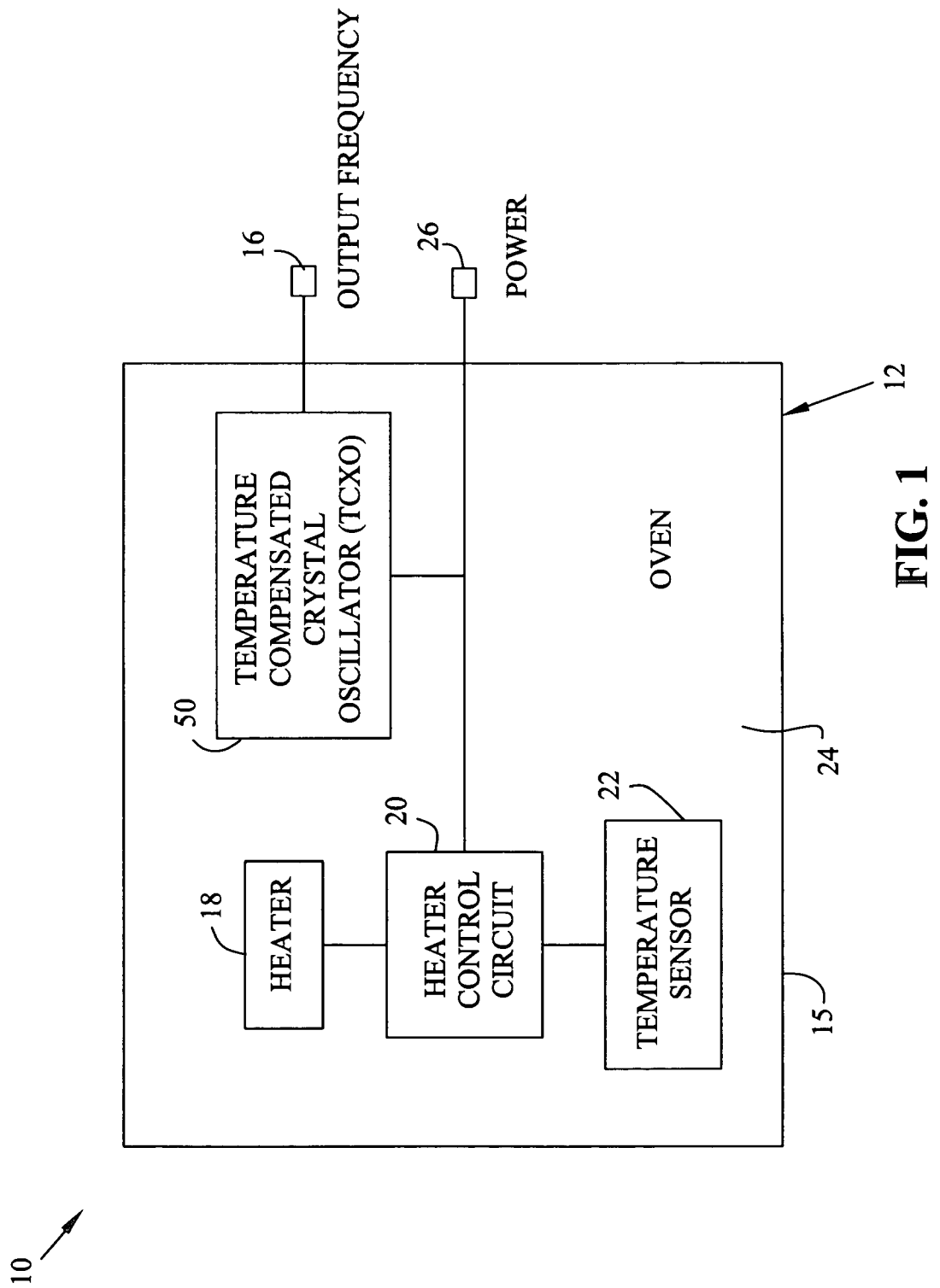
FIG. 1 is a diagrammatic view of a temperature compensated crystal oscillator (TCXO) located inside a temperature controlled oven in accordance with the present invention.

Referring to FIG. 1, a diagrammatic view of a temperature compensated crystal oscillator (TCXO) located inside a temperature controlled oven is shown. Oscillator assembly 10 includes an oven 12 which contains the oscillator components. Oven 12 can include a metal housing 14 with a cavity 15 that contains foam insulation 24. A temperature compensated crystal oscillator (TCXO) 50 is located inside oven 12. TCXO 50 can be any type of oscillator that uses any type of resonator. For example, TCXO 50 can be a Colpitts oscillator using an AT-cut quartz crystal resonator. TCXO 50 generates and provides a stable reference frequency at output terminal 16.

A heater 18 is located in oven 12. Heater 18 is typically a transistor in which the dissipated power is proportionally controlled to heat and maintain a constant temperature inside oven 12. A temperature sensor 22 is located inside housing 14. Sensor 22 is a negative-coefficient conventional thermistor. The temperature sensor monitors the temperature of TCXO 50.

Connected to sensor 22 and heater 18 is a control circuit 20 which controls heater 18. Control circuit 20 receives a temperature signal as an input from sensor 22 and provides a heater control signal as an output to heater 18. When the temperature falls below the selected setpoint for the oven, control circuit 20 increases power to heater 18 to increase the temperature in oven 12. When the temperature is above the setpoint for the oven, control circuit 20 reduces power to heater 18 to allow a decrease in the temperature in oven 12. Power is applied to the oscillator assembly through terminal 26. Terminal 26 is connected with TCXO 50 and the heater control circuit 20.

Oven 12 can be a single oven or a double oven. Oven 12 may include an evacuated region in order to improve the temperature performance of the oscillator.

Oscillator assembly 10 can be operated where the operation of TCXO 50 is optimized for temperatures around the setpoint of the oven and has a frequency stability of about 20 PPB. Oven 12 will consume approximately 1 watt of power during operation.

Oscillator Circuit

Figure 2:
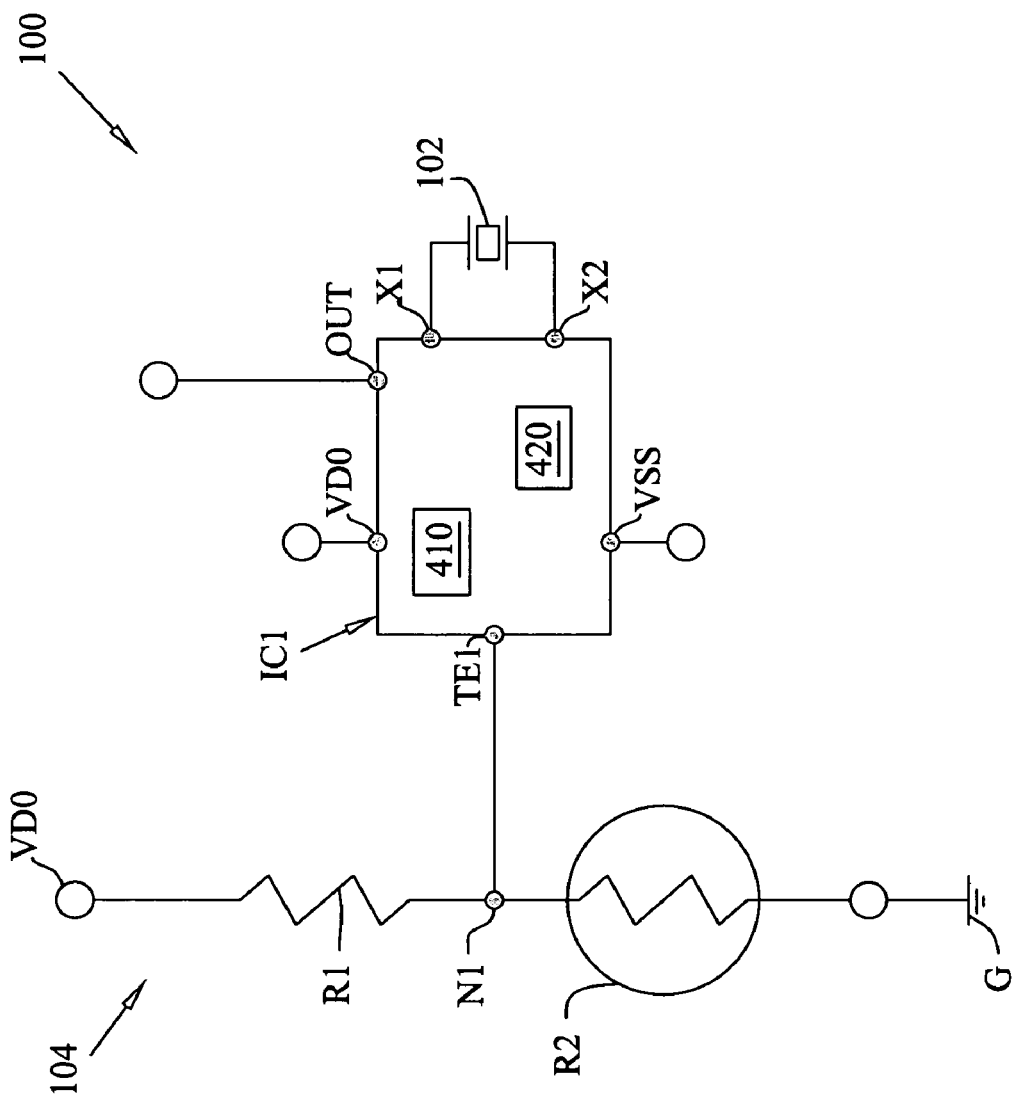
FIG. 2 is a schematic view of one embodiment of a TCXO in accordance with the present invention.

Referring to FIG. 2, a schematic diagram of an embodiment of a temperature compensated crystal oscillator (TCXO) 100 in accordance with the present invention is shown. TCXO 100 can replace TCXO 50 of FIG. 1. TCXO 100 is adapted to be mounted in oven 12. TCXO 100 includes a temperature compensation integrated circuit IC1. Integrated circuit IC1 can be designed for use with oscillators including, for example, part number MAS9279 integrated circuit that is commercially available from Micro Analog Systems Oy of Espoo, Finland. Integrated circuit IC1 is optimized for use with an AT-cut quartz crystal. Integrated circuit IC1 is produced in large quantities and therefore can be purchased at a reasonable cost. Integrated circuit IC1 can contain an oscillator circuit 410 and a temperature compensation circuit 420. Integrated circuit IC1 can operate as a TCXO with only the addition of a resonator or crystal.

Integrated circuit IC1 includes terminals Vdd, Out, X1, X2, Vss, and TE1. Terminal Vdd is connected with a 3.3 volt power source and terminal Vss is connected to ground. Crystal terminals X1 and X2 are connected across the resonator 102, which typically is a quartz crystal. Resonator 102 preferably is an SC-cut quartz crystal. Resonator 102 could also be a mesa-type crystal or other bulk resonator such as lithium niobate. Terminal TE1 is the temperature input/output terminal. Terminal Out is the reference frequency output terminal.

An external temperature sensor 104 is connected with terminal TE1. A temperature sensor (not shown) is also located within integrated circuit IC1, but is not used in this embodiment. Temperature sensor 104 is mounted in close proximity to resonator 102. Temperature sensor 104 includes a pair of serial connected resistors R1 and R2 that are connected at node N1. Resistor R2 is a thermistor that changes resistance with temperature. Resistor R1 is a fixed resistor. One end or resistor R2 is connected to node N1 and the other end is connected to ground. One end of resistor R1 is connected to power source Vdd and the other end is connected to node N1. Node N1 is connected to terminal TE1.

During the operation of the oscillator with TCXO 100, oven 12 is maintained at a substantially constant temperature by sensor 22, heater 18 and control circuit 20. Integrated circuit IC1 contains oscillator circuit 410 that produces the reference frequency that is stabilized by resonator 102. Temperature sensor 104 generates a temperature signal that is proportional to the temperature to which resonator 102 is exposed. The output voltage of temperature sensor 104 can be adjusted to a desired voltage range by the selection of appropriate values for resistors R1 and R2 and voltage Vdd.

Integrated circuit IC1 contains a temperature compensation circuit 420 that uses the temperature signal to adjust the reference frequency that is produced at terminal Out. The temperature compensation circuit maintains the reference frequency within a determined tolerance.

Figure 7:
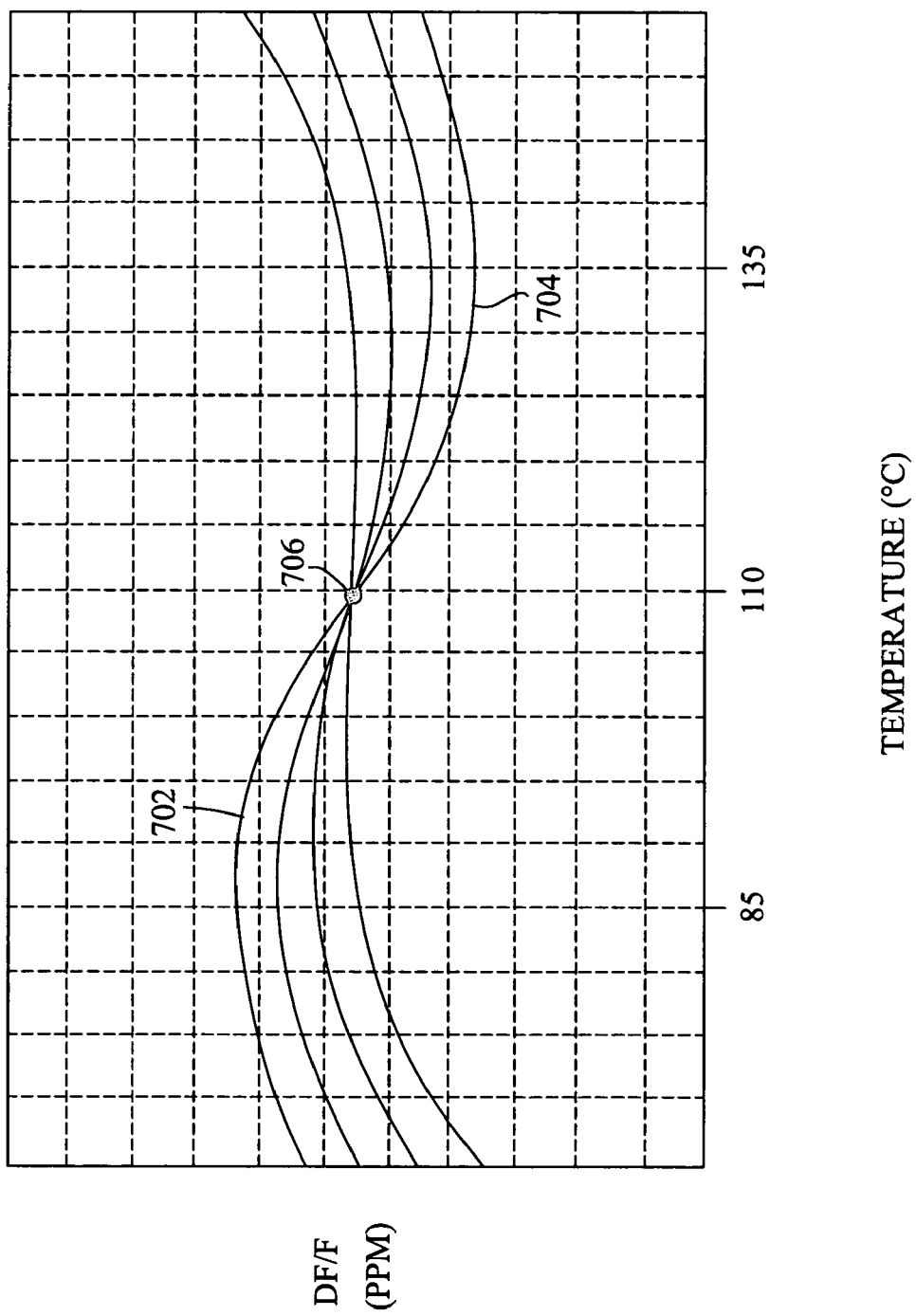
FIG. 7 is a graph of frequency change versus temperature for several SC-cut crystals at different cut angles.
Figure 8:
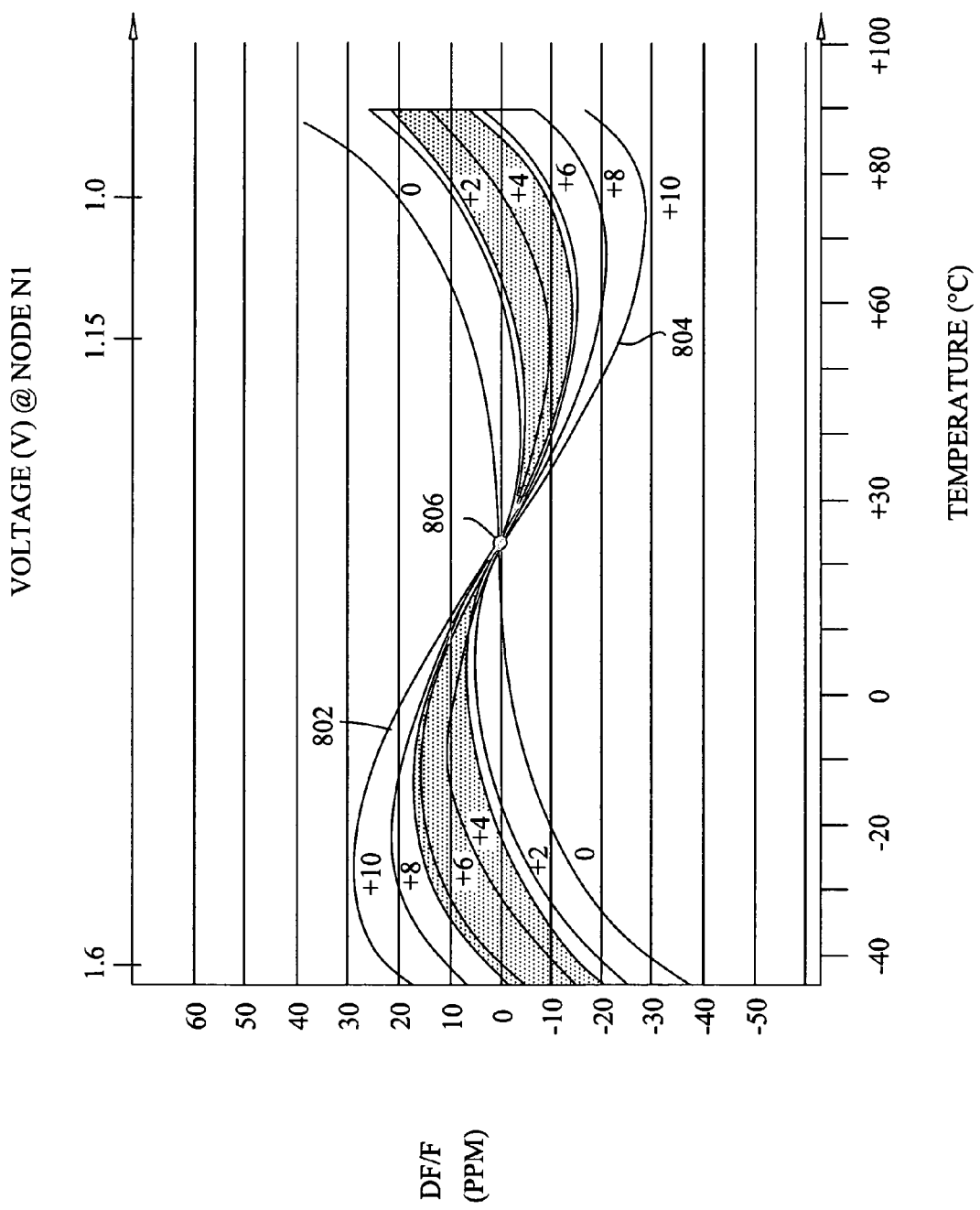
FIG. 8 is a graph of frequency change versus temperature for several AT-cut crystals at different cut angles.

Turning now to FIGS. 7 and 8, a graph of frequency change versus temperature, Bechmann curve for several SC-cut crystals at different cut angles is shown in FIG. 7 and a Bechmann curve for several AT-cut crystals at different cut angles is shown in FIG. 8. FIG. 7 shows that the rate of change of frequency with temperature for an SC-cut crystal is minimized by operating around the maximum 702 or minimum 704 values of the sinusoidal curve. This is called the turning point of the crystal. FIG. 7 also has an inflection point 706. In other words, the frequency response line has a small slope. For an SC-cut crystal, the preferred operating or oven set-point temperature value typically is around 85 degrees Centigrade.

Integrated circuit IC1 is designed to compensate the frequency change versus temperature curve for an AT-cut crystal shown in FIG. 8. FIG. 8 has turning points 802 and 804 and an inflection point 806. It is noted that if an SC-cut crystal is operated at the SC-cut turning point of 85 degrees Centigrade in FIG. 8, there is a change in frequency with a change in temperature. In other words, the frequency response line has a large or steep slope.

In order to use the integrated circuit IC1 that was designed for use with both an AT-cut crystal and an SC-cut crystal and obtain good frequency response over temperature, the integrated circuit must be compensated, tricked or provided with the illusion that it is operating at another temperature, when in reality it is not.

Integrated circuit IC1 is adjusted to operate around the 60 degree point in FIG. 8 by the selection of resistors R1 and R2 in FIG. 2 such that the voltage generated at node N1 or terminal TE1 is approximately 1.15 volts as shown in FIG. 8. This voltage would typically be about 1.0 volts for use with an AT-cut crystal as shown by the value of 1.0 volts located at the tuning point in FIG. 8.

The present invention provides the illusion to integrated circuit IC1 that the resonator 102 is operating at the turning point 804 of an AT cut quartz crystal when in reality the resonator 102 is operating at the turning point 702 of an SC cut quartz crystal.

This allows the use of an integrated circuit designed for an AT-cut crystal to be used with an SC-cut crystal. There are many advantages to this design. It avoids the need to design a new integrated circuit specifically for use with an SC-cut crystal and is lower in cost, since AT-cut crystals are used in higher volume applications than SC-cut crystals.

First Alternative Oscillator Circuit

Figure 3:
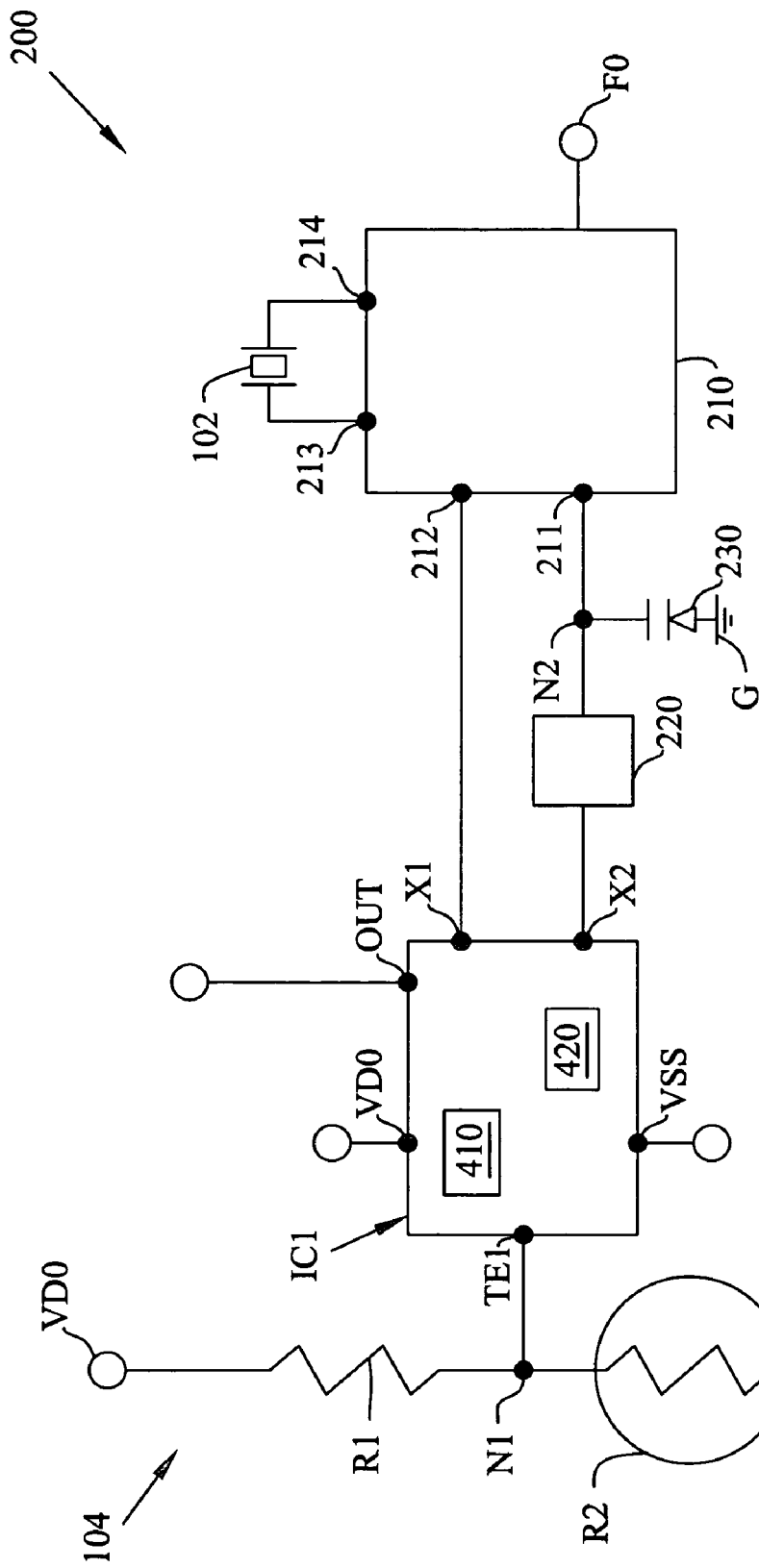
FIG. 3 is a schematic view of another embodiment of a TCXO in accordance with the present invention.

Referring to FIG. 3, a schematic diagram of another embodiment of a temperature compensated crystal oscillator (TCXO) 200 is shown. TCXO 200 can replace or be used for TCXO 50 of FIG. 1.

Figure 4:
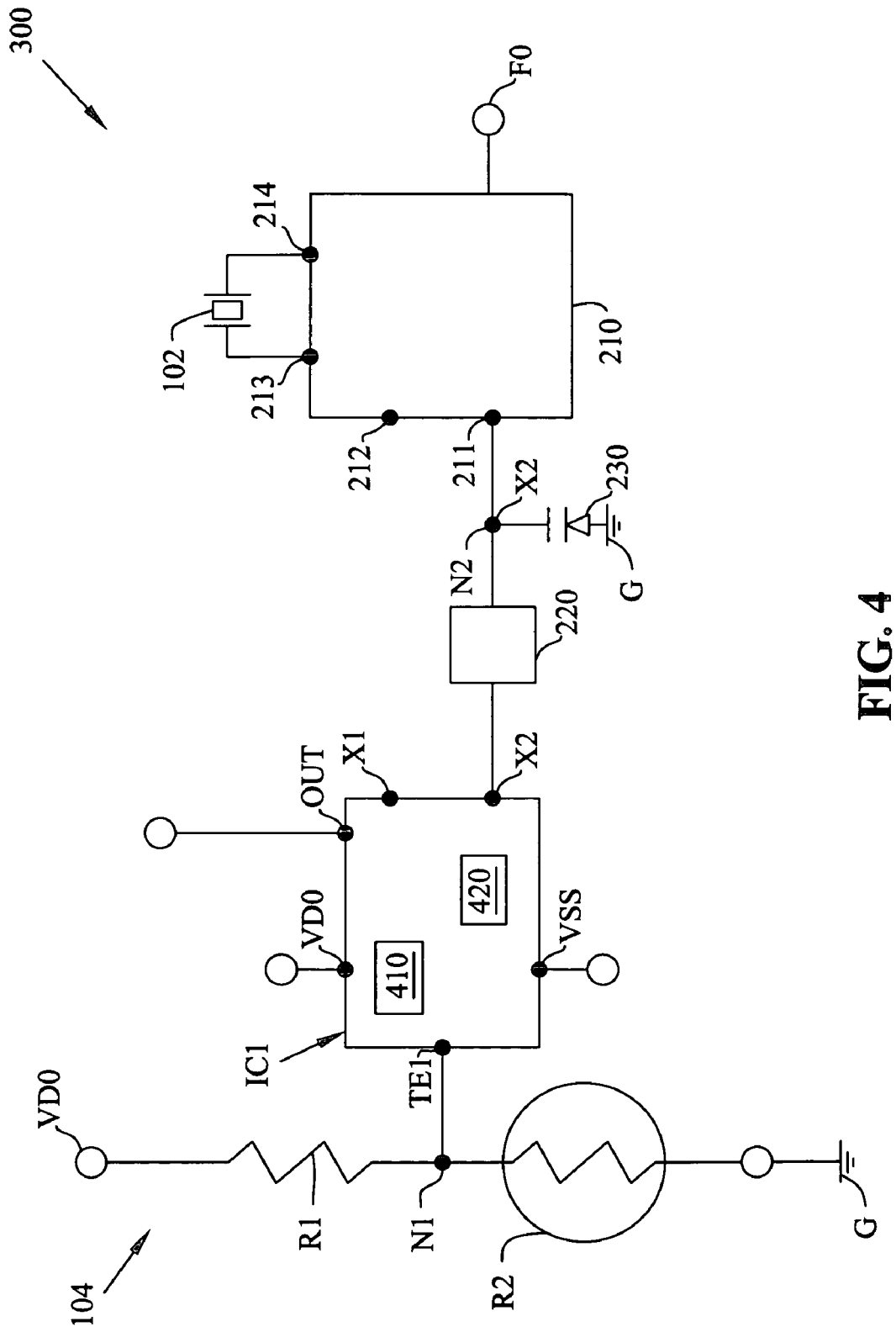
FIG. 4 is a schematic view of an additional embodiment of a TCXO in accordance with the present invention.

TCXO 200 is similar to TCXO 100 except that a separate external oscillator circuit 210, low pass filter 220 and varactor diode 230 have been added. In FIG. 4, oscillator circuit 410, internal to integrated circuit IC1, is not used.

Oscillator circuit 210 is connected with crystal terminals X1 and X2. In FIG. 3, the internal oscillator circuit of integrated circuit IC1 is not used and is bypassed by the use of oscillator circuit 210. Oscillator circuit 210 can be a conventional oscillator circuit such as a Pierce or Colpitts oscillator circuit as will be discussed later in FIG. 6. Oscillator circuit 210 has terminals 211, 212, 213, 214 and Fo. Terminal 212 is connected to crystal terminal X1. Terminals 213 and 214 are connected across resonator 102. Terminal Fo is the output frequency terminal.

A varactor diode 230 is connected between ground and node N2. Varactor diode 230 has an adjustable capacitance that can be used to tune the operating frequency of the oscillator. Node N2 is connected with terminal 211. A low pass filter 220 is connected between node N2 and terminal X2. Low pass filter 220 delays the correaction voltage supplied to varactor diode 230 to better match the thermal profile of crystal resonator 102.

During the operation of the oscillator with TCXO 200, oven 12 is maintained at a substantially constant temperature by sensor 22, heater 18 and control circuit 20. Oscillator circuit 210 produces the reference frequency that is stabilized by resonator 102. Oscillator circuit 410 is not used.

Temperature sensor 104 generates a temperature signal that is proportional to the temperature to which resonator 102 is exposed. Integrated circuit IC1 contains the temperature compensation circuit 420 that uses the temperature signal to adjust the reference frequency that is produced at terminal Fo. The temperature compensation circuit 420 maintains the reference frequency within a tight tolerance. Integrated circuit IC1 operates the same as previously discussed for TCXO 100.

Figure 6:
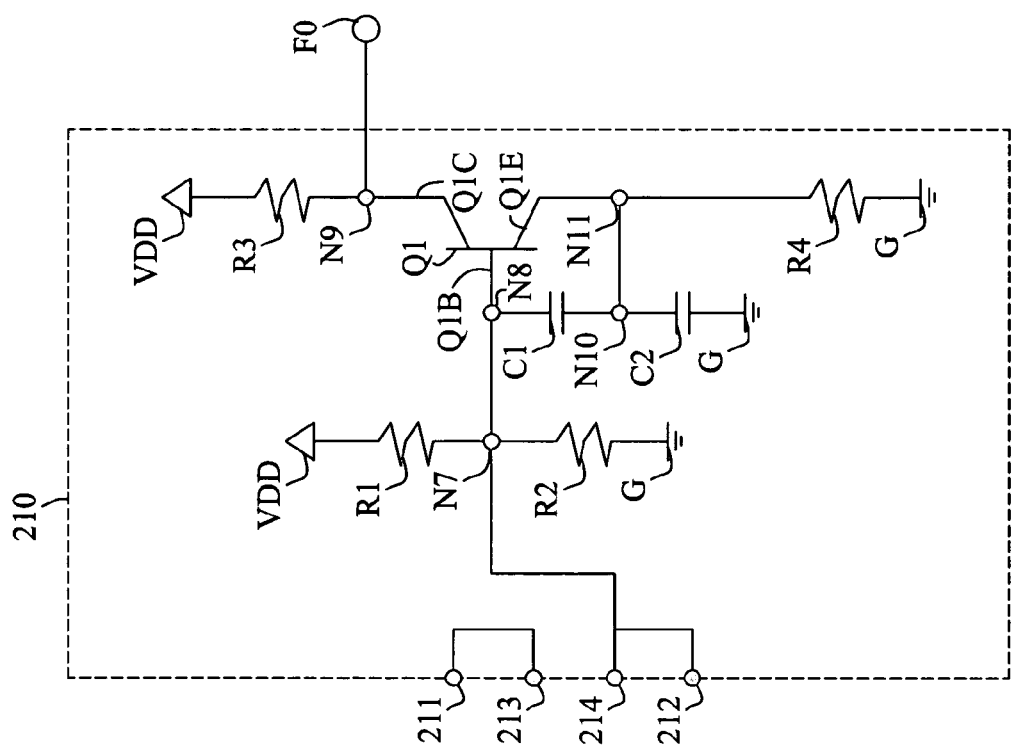
FIG. 6 is a schematic view of a Colpitts oscillator circuit.

Referring to FIG. 6, a Colpitts oscillator circuit 210 is shown. Oscillator circuit 210 includes a transistor Q1 that has a base Q1B, a collector Q1C and an emitter Q1E. Base Q1B is connected to node N8. Collector Q1C is connected to node N9 and resistor R3, which is connected to power supply Vdd. Node N9 is further connected to output terminal Fo. Emitter Q1E is connected to Node N11, which is connected to resistor R4. Resistor R4 is further connected to ground G. Capacitor C1 is connected between node N8 and node N10. Capacitor C2 is connected between node N10 and ground.

Resistor R1 is connected between node N7 and power supply Vdd. Resistor R2 is connected between node N7 and ground. Node N7 is connected to terminals 212 and 214.

Second Alternative Oscillator Circuit

Referring to FIG. 4, a schematic diagram of another embodiment of a temperature compensated crystal oscillator (TCXO) 300 is shown. TCXO 300 can replace or be used for TCXO 50 of FIG. 1.

TCXO 300 is similar to TCXO 200 except that the connection between terminal X1 and terminal 212 has been eliminated.

Integrated Circuit

Figure 5:
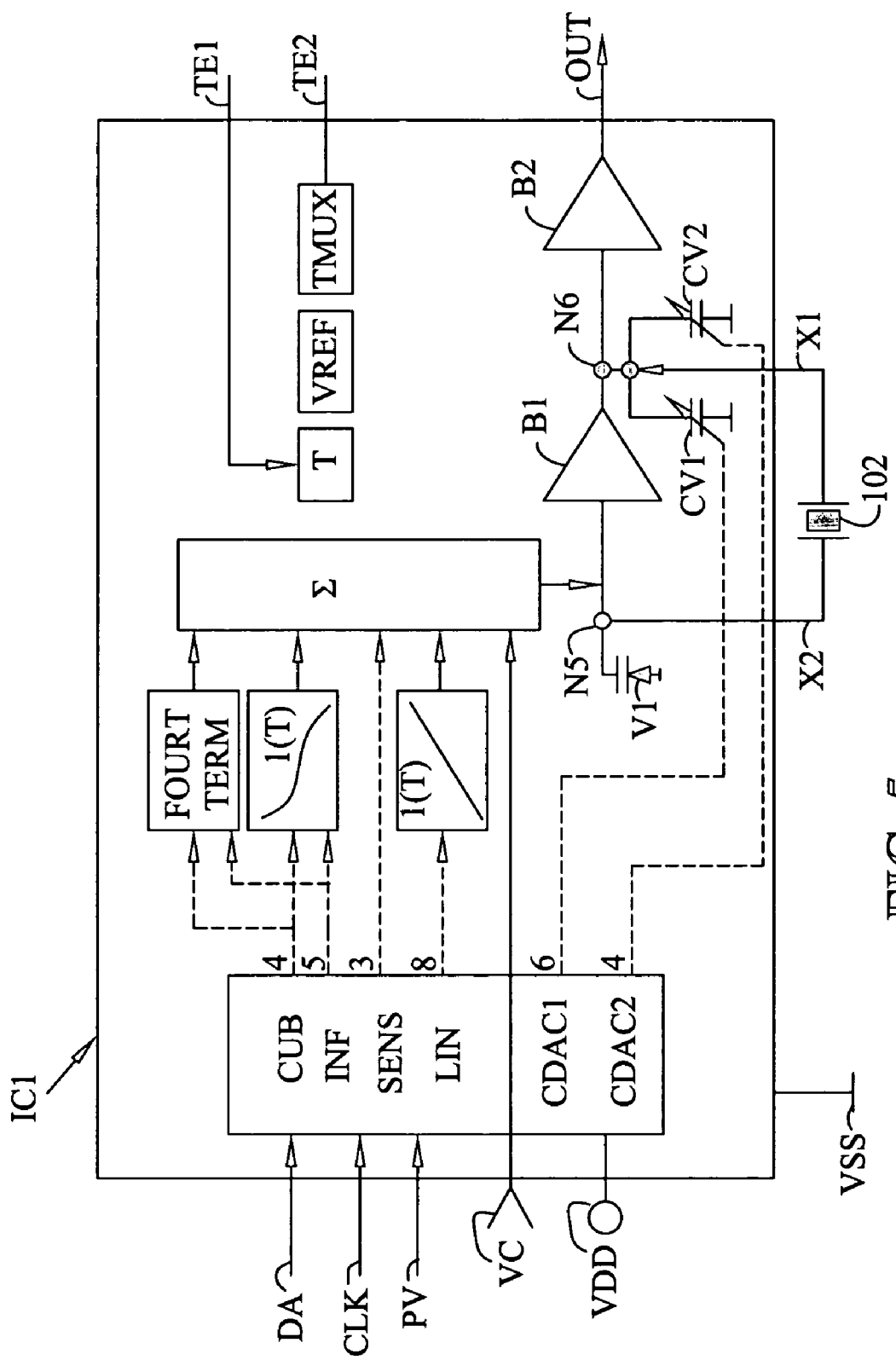
FIG. 5 is a schematic view of the integrated circuit of FIGS. 2 and 3.

Referring to FIG. 5, a block diagram of integrated circuit IC1 is shown. Integrated circuit IC1 includes a power supply terminal Vdd that provides power to the chip. Programming input terminal PV is used for programming the temperature compensation registers after they have been calibrated. Clock input terminal CLK is used only during calibration. Data input terminal DA provides digital serial data to the internal registers.

Temperature input/output terminal TE1 can provide an output voltage from the internal temperature sensor T or can accept an externally generated temperature sensitive voltage. In the present invention, the voltage at terminal TE1 is set such that integrated circuit IC1 can be used with an SC cut quartz crystal. Test multiplexer output terminal TE2 is used for testing IC1. Voltage control input terminal VC is used to tune the varactor voltage to the respective frequency within the application. Crystal terminals X1, and crystal/varactor terminal X2 can be connected with a resonator. Ground terminal Vss is connected to ground. Buffer output terminal out provides an output frequency.

Several internal circuits and registers are contained within integrated circuit IC1. Cubic register CUB sets the scaling of the cubic control voltage part of the varactor control voltage. The inflection point register INF sets the inflection point of the cubic control voltage of the varactor control voltage. The sensitivity register SENS sets the scaling of the overall varactor control voltage. The linear compensation register LIN sets the slope of the varactor control voltage. The CDAC1 fine offset compensation register compensates the crystal offset by changing the load capacitance through variable capacitor CV1. The CDAC2 offset compensation register is used for coarse tuning of the output frequency by changing the load capacitance through variable capacitor CV2.

The values of the cubic, inflection point, sensitivity and linear registers are summed in the summing register Σ. The output of the summing register is provided to node N5 as a compensation voltage. Node N5 is connected to terminal X2, the input of buffer B1 and varactor diode V1. Node N6 is connected to the output of buffer B1, variable capacitors CV1 and CV2 and the input of buffer B2. Terminals X1 and X2 can be connected to resonator 102.

Method of Operation

Figure 9:
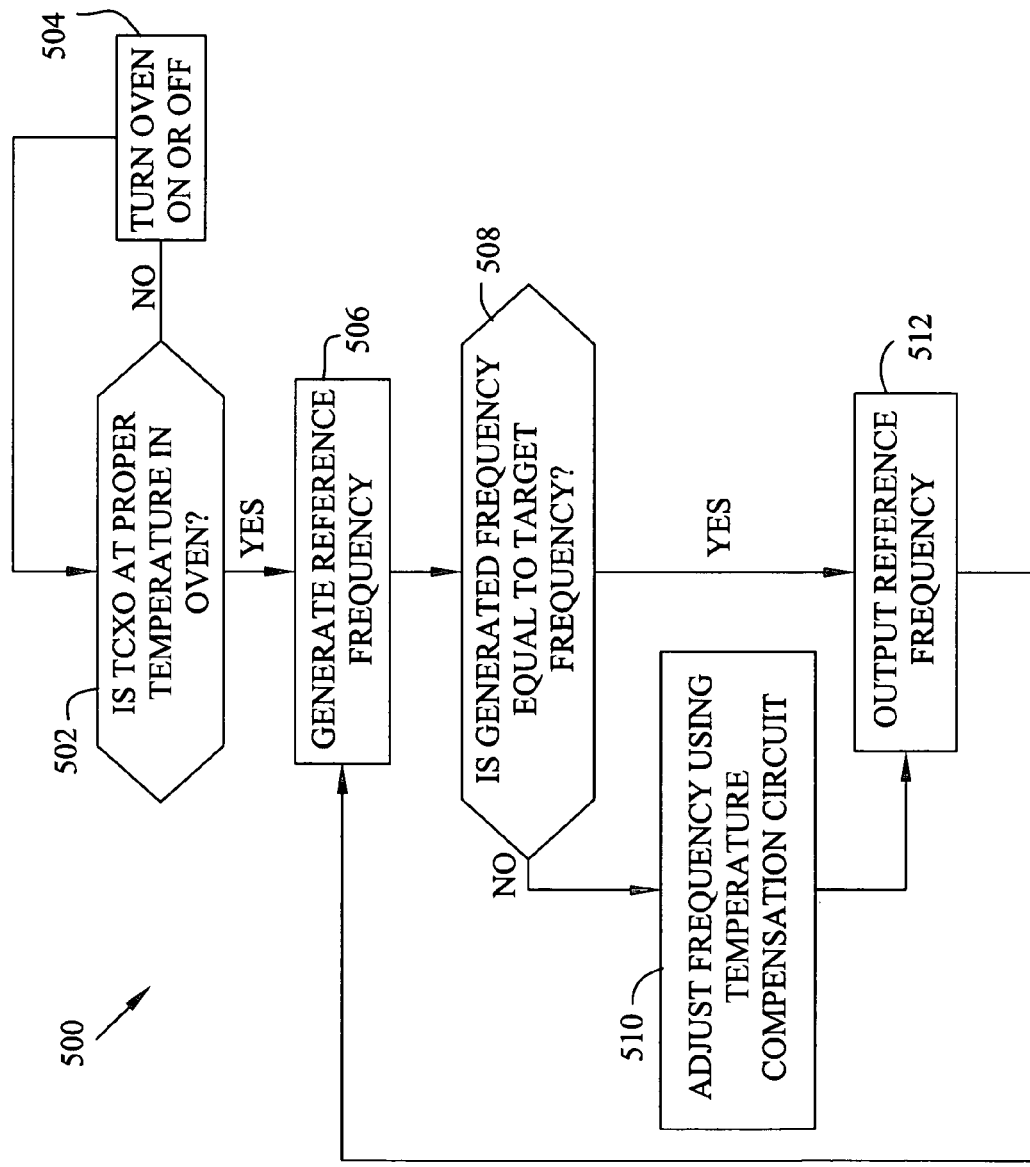
FIG. 9 is a flowchart of a method of operating an oscillator in accordance with the present invention.

Turning now to FIGS. 1 and 9, a method of operating an oscillator in accordance with the present invention is shown. Method 500 includes decision step 502. At decision step 502, the control circuit 20 checks to see if the TCXO 50 is at the proper temperature. If the oven 12 is not at the correct temperature, method 500 proceeds to step 504 where the heater 18 is turned on or off depending upon the temperature. After the oven reaches the proper temperature, step 504 returns to decision 502 to confirm the proper temperature of the oven.

If the oven is at the correct temperature, method 500 proceeds to step 506 where the reference frequency is generated by the TCXO 50. Next, the generated frequency is compared to the target frequency at decision step 508. If the generated frequency is equal to the target frequency, the reference frequency is outputted or provided at step 512. If the generated frequency is not equal to the target frequency, method 500 proceeds to step 510. At step 510, the generated frequency is adjusted by TCXO 50. The resulting reference frequency is outputted or provided at step 512.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. An oscillator comprising:
    a SC cut resonator having a SC cut resonator turning point;
    an oscillator circuit connected to the SC cut resonator and operable to produce a reference frequency;
    a temperature compensation circuit connected to the oscillator circuit, the temperature compensation circuit configured to compensate an AT cut resonator having an AT cut turning point;
    a first temperature sensor connected to the temperature compensation circuit, the first temperature sensor being adapted to provide a temperature signal to the temperature compensation circuit, the temperature signal causing the temperature compensation circuit to operate at the SC cut resonator turning point;
    a varactor connected to the oscillator; and
    an oven, wherein the SC cut resonator, the oscillator circuit, the temperature compensation circuit, the first temperature sensor and the varactor are all located inside the oven, the oven comprising:
    a heater located in proximity to the SC cut resonator;
    a second temperature sensor located in proximity to the SC cut resonator; and
    a heater control circuit in communication with both the second temperature sensor and the heater for controlling the heater.

2. The oscillator according to claim 1, wherein the second temperature sensor includes a thermistor having a first end and a second end and a first resistor having a third end and a fourth end, the first end being connected to a voltage source, the second end connected to the third end and the fourth end connected to ground, the second and third ends further being connected to the temperature compensation circuit.

3. The oscillator according to claim 1, wherein the temperature compensation circuit is adapted to compensate at least a portion of a Bechmann curve.

4. The oscillator according to claim 1, wherein the temperature compensation circuit has a third temperature sensor.

5. The oscillator according to claim 4, wherein the third temperature sensor is disabled.

6. The oscillator according to claim 1, wherein the temperature compensation circuit is an integrated circuit that includes a second oscillator circuit.

7. The oscillator according to claim 2, wherein the oscillator circuit comprises:
    a transistor having a base, an emitter and a collector;
    a second resistor having a fifth end and a sixth end, the fifth end connected to a voltage source;
    a third resistor having a seventh end and an eighth end, the sixth end connected to the seventh end at a first node, the eighth end connected to ground, the base connected to the first node;
    a fourth resistor connected between the voltage source and the collector;
    a fifth resistor connected between the emitter and ground; and
    a first and second capacitor coupled between the base and ground.

8. The oscillator according to claim 1, wherein the oven operates at a temperature between 80 to 95 degrees Centigrade.

9. The oscillator according to claim 1, wherein a low pass filter is connected with the oscillator circuit.

10. An oscillator, comprising:
    frequency stabilizing means for stabilizing a reference frequency, the frequency stabilizing means being a SC cut crystal that has a first turning point associated with the SC cut crystal;
    an oscillator circuit connected with the frequency stabilizing means for generating the reference frequency;
    temperature compensation means connected with the oscillator circuit for adjusting the reference frequency in response to changes in temperature, the temperature compensation means being adapted to compensate an AT cut crystal that has a second turning point, the temperature compensation means being configured to operate at the second turning point, the temperature compensation means including a temperature compensation circuit and a first temperature sensor, the first temperature sensor being connected with the temperature compensation circuit, the first temperature sensor causing the temperature compensation circuit to operate at the first turning point;
    an oven containing the frequency stabilizing means, the oscillator circuit and the temperature compensation means, the oven being operable to maintain a pre-determined temperature, the oven including:
        a housing;
        a heater mounted in the housing in proximity to the frequency stabilizing means;
        a second temperature sensor located in proximity to the frequency stabilizing means for measuring the temperature of the frequency stabilizing means; and
        a control circuit connected with the second temperature sensor and the heater for controlling the heater.

11. The oscillator according to claim 10, wherein the first temperature sensor includes a thermistor having a first end and a second end and a first resistor having a third end and a fourth end, the first end being connected to a voltage source, the second end connected to the third end and the fourth end connected to ground, the second and third ends further being connected to the temperature compensation circuit.

12. The oscillator according to claim 10, further comprising a low pass filter connected with the oscillator circuit.

13. The oscillator according to claim 10, wherein the temperature compensation means further includes a third temperature sensor.

14. The oscillator according to claim 13, wherein the third temperature sensor is disabled.

15. The oscillator according to claim 11, wherein the oscillator circuit comprises:
   a transistor having a base, an emitter and a collector;
   a second resistor having a fifth end and a sixth end, the fifth end connected to a voltage source;
   a third resistor having a seventh end and an eighth end, the sixth end connected to the seventh end at a first node, the eighth end connected to ground, the base connected to the first node;
   a fourth resistor connected between the voltage source and the collector;
   a fifth resistor connected between the emitter and ground; and
   a first and second capacitor coupled between the base and ground.

16. An oscillator comprising:
   an oscillator circuit;
   an SC cut resonator connected with the oscillator circuit, the SC cut resonator having an associated first change in frequency with temperature response;
   a temperature compensation circuit connected with the oscillator circuit, the temperature compensation circuit being adapted to adjust a reference frequency generated by the oscillator circuit according to a second change in frequency with temperature response associated with an AT cut resonator;
   a first temperature sensor in communication with the temperature compensation circuit, the first temperature sensor being adapted to generate a temperature dependent voltage and to provide the temperature dependent voltage to the temperature compensation circuit such that the temperature compensation circuit operates at the first change in frequency with temperature response, the first temperature sensor including a thermistor having a first end and a second end and a first resistor having a third end and a fourth end, the first end being connected to a voltage source, the second end connected to the third end and the fourth end connected to ground, the second and third ends further being connected to the temperature compensation circuit;
   an oven, the oscillator circuit, the SC cut resonator, the temperature compensation circuit and the first temperature sensor located within the oven, the oven comprising:
      a heater;
      a second temperature sensor mounted in proximity to the SC cut resonator;
      a heater control circuit in communication with the second temperature sensor and the heater, the heater control circuit being adapted to regulate operation of the heater; and
      a third temperature sensor in communication with the temperature compensation circuit.

17. The oscillator according to claim 16, wherein the first change in frequency with temperature response is around 85 degrees centigrade.

18. The oscillator according to claim 16, wherein the temperature compensation circuit is an integrated circuit that includes a second oscillator circuit.

19. The oscillator according to claim 16, wherein the oscillator circuit comprises:
   a transistor having a base, an emitter and a collector;
   a second resistor having a fifth end and a sixth end, the fifth end connected to a voltage source;
   a third resistor having a seventh end and an eighth end, the sixth end connected to the seventh end at a first node, the eighth end connected to ground, the base connected to the first node;
   a fourth resistor connected between the voltage source and the collector;
   a fifth resistor connected between the emitter and ground; and
   a first and second capacitor coupled between the base and ground.

20. The oscillator according to claim 16, wherein the third temperature sensor is disabled.

* * * * *